(12) United States Patent
Rao et al.

(10) Patent No.: US 7,053,806 B1
(45) Date of Patent: May 30, 2006

(54) SYSTEM AND METHOD FOR CALIBRATION OF AUTORANGING ARCHITECTURES

(75) Inventors: Naresh Kesavan Rao, Clifton Park, NY (US); Jianjun Guo, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/094,903

(22) Filed: Mar. 31, 2005

(51) Int. Cl.
*H03M 1/10* (2006.01)

(52) U.S. Cl. ............ 341/120; 341/118; 341/138; 341/141; 378/98.8

(58) Field of Classification Search .......... 341/118, 341/120, 141, 161
See application file for complete search history.

(56) References Cited

U.S. PATENT DOCUMENTS

| | | | |
|---|---|---|---|
| 5,543,795 A | * | 8/1996 | Fernald .............. 341/163 |
| 5,568,530 A | * | 10/1996 | Saito et al. ............ 378/4 |
| 5,635,937 A | | 6/1997 | Lim et al. ............ 341/161 |
| 6,798,864 B1 | * | 9/2004 | Petrick et al. ........ 378/98.8 |

* cited by examiner

*Primary Examiner*—Rexford Barnie
*Assistant Examiner*—Khai Nguyen
(74) *Attorney, Agent, or Firm*—Fletcher Yoder

(57) ABSTRACT

A method for calibrating a segmented analog to digital signal conversion system is provided. The method includes segmenting a desired relationship between DAC output values and desired ADC input values into a plurality of segments. Each of the plurality of segments includes an offset value and a gain value. The method also includes computing the offset value and an offset coefficient for each of the plurality of segments, computing the gain value and an gain coefficient for each of the plurality of segments, and storing the offset value and the gain value for each of the plurality of segments in a memory unit for reference in converting an analog signal to a digital signal based upon the gain value and offset value.

26 Claims, 14 Drawing Sheets

| SEGMENT | $V_{in}$ RANGE | $V_{in}$ RESOLUTION | $\dfrac{1}{Gain(i)}$ | $\beta_{seg} V_{offset(i)}$ |
|---|---|---|---|---|
| ⋮ | ⋮ | ⋮ | ⋮ | ⋮ |
| ⋮ | ⋮ | ⋮ | ⋮ | ⋮ |

FIG. 14

SYSTEM AND METHOD FOR CALIBRATION OF AUTORANGING ARCHITECTURES

BACKGROUND

The invention relates generally to signal processing, and more particularly to a system and method for calibrating autoranging analog-to-signal conversion architecture.

Signal processing is a valuable tool for various applications that involve data transmission, data storage, and the like. One aspect of signal processing, for certain applications, is to convert an analog signal into its digital equivalent to facilitate storage, transmission, workability, signal conditioning, noise filtering, and the like.

One method for performing analog-to-digital (A/D) signal conversion is to use a single digital-to-analog converter (DAC) for providing a base analog signal for comparison to an input analog signal that requires conversion. To facilitate faster conversion rate in such a process, a segmented approach or an autoranging architecture, that automatically selects a segment having the analog value that is to be converted, may be utilized. This involves transformation of a reference segment to imitate a desired segment by multiplying the reference segment by a gain value and adding an offset value to the reference segment.

Although such a method improves the conversion rate substantially, an erroneous value of either the gain or offset or both may lead to incorrect digitization. For example, if an erroneous value of gain exists, a segment would be constructed to have a slope different from the desirable slope. This may result in an overlap band if the slope is higher than the desirable slope. An overlapped band would result in certain data points having more than one digital equivalent. If the slope is lesser than the desirable slope, this may result in a dead band. A dead band would result in certain data points not being digitized. Similarly, if an erroneous offset value exists, a segment would shift from the desirable location. This may result in both an overlap band and a dead band.

A method and system for calibrating a pipelined A/D conversion system for eliminating the effects of variance in gain and offset values, is therefore desirable.

SUMMARY

A method for calibrating a segmented analog to digital signal conversion system is provided. The method includes segmenting a desired relationship between DAC output values and desired ADC input values into a plurality of segments. Each of the plurality of segments includes an offset value and a gain value. The method also includes computing the offset value and an offset coefficient for each of the plurality of segments, computing the gain value and an gain coefficient for each of the plurality of segments, and storing the offset value and the gain value for each of the plurality of segments in a memory unit for reference in converting an analog signal to a digital signal based upon the gain value and offset value.

These and other advantages and features will be more readily understood from the following detailed description of preferred embodiments of the invention that is provided in connection with the accompanying drawings.

BRIEF DESCRIPTION OF THE DRAWINGS

FIG. 14 is a diagrammatic view of an exemplary memory stack utilized in the digital acquisition system in accordance with aspects of the present technique.

DETAILED DESCRIPTION

Figure 1:
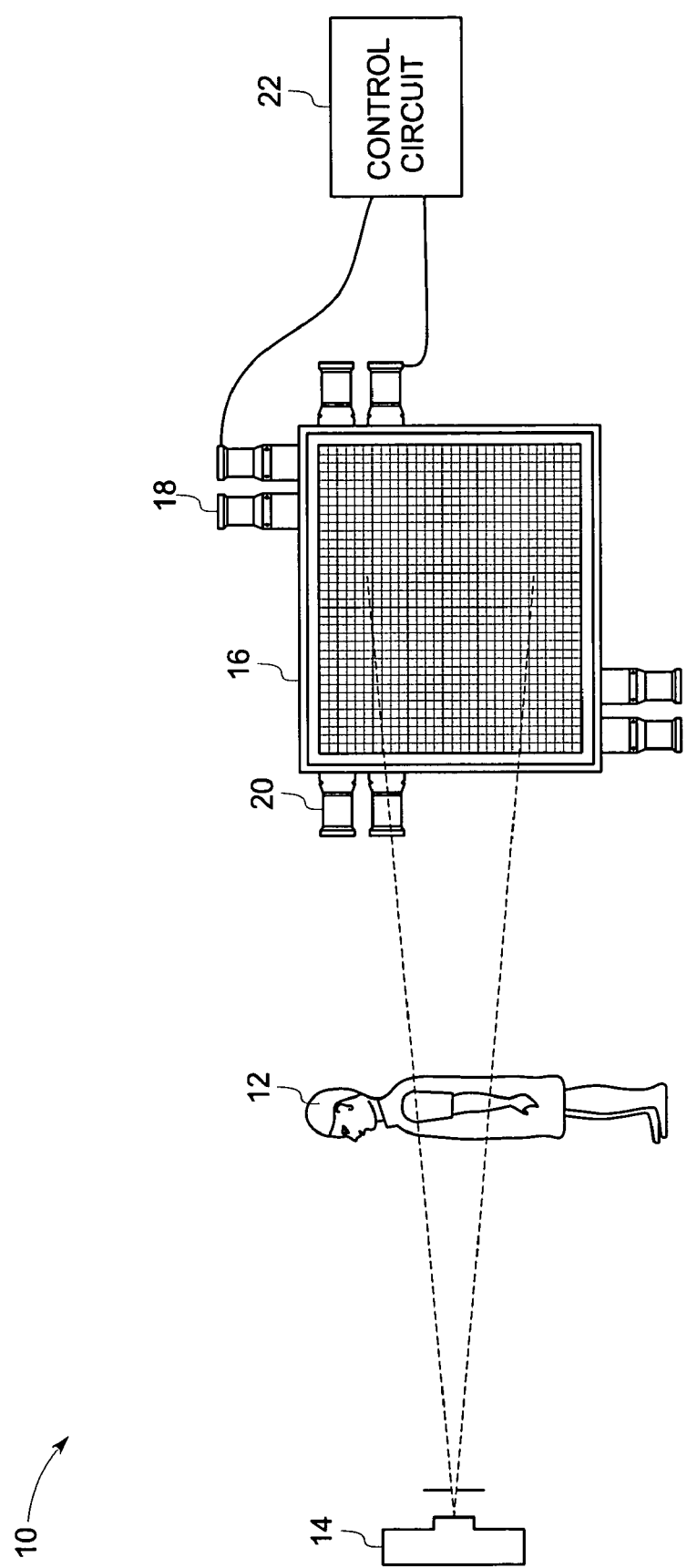
FIG. 1 is a diagrammatic view of an exemplary system that may benefit from A/D conversion in accordance with aspects of the present technique, in the form of a digital X-ray system.

In the subsequent paragraphs, various aspects of a technique for calibrating a pipelined A/D conversion system will be explained in detail. The various aspects of the present technique will be explained, by way of example only, with the aid of figures hereinafter. Referring generally to FIG. 1, the present technique for calibrating a pipelined A/D conversion system will be described by reference to an exemplary digital X-ray system designated generally by numeral 10. It should be borne in mind, however, that the technique may find application in a range of settings and systems, and that its use in the X-ray system shown is but one such application.

The digital X-ray system 10 of FIG. 1 is operable to capture an X-ray projection of a portion of the body of a subject 12 under medical examination. However, as will be appreciated by those skilled in the art, the digital X-ray system 10 may also be utilized for non-destructive evaluation (NDE) of materials, such as castings, forgings, or pipelines, inspection of parts, parcels and baggage, and other such applications. The digital X-ray system 10 comprises an X-ray source 14 that is used to scan the subject 12. The X-ray source 14 generates X-ray beams that penetrate through the subject 12. In a typical medical application, the X-ray beams may be attenuated based on the texture of the organs, skin, lesions, muscle, bones and the like, in the various portions of the body of the subject 12. The attenuated X-rays are captured by a digital X-ray panel 16, as illustrated in FIG. 1, which comprises a plurality of photodiodes that form a pixel array. The projection thus formed, is read row-by-row or column-by-column by one or more data modules 18, where each line of pixels may be enabled for scanning, by one or more scan modules 20. Control circuitry 22 is used to control the operation of the data modules 18 and the scan modules 20.

Figure 2:
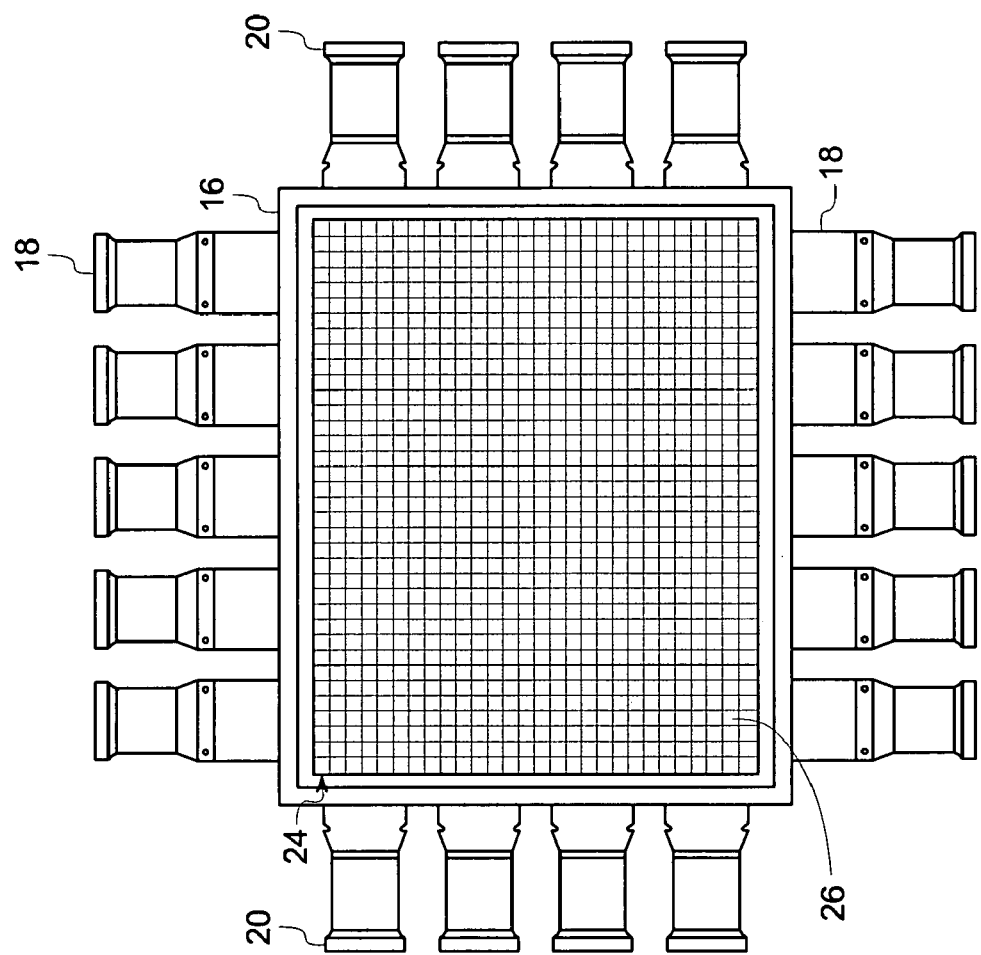
FIG. 2 is a diagrammatic view of an exemplary digital X-ray panel of a type that may be used in a system such as that of FIG. 1 for generating analog signals to be converted to digital signals in accordance with aspects of the present technique.

FIG. 2 is a diagrammatic view of an exemplary digital X-ray panel 16. The digital X-ray panel 16 comprises a plurality of rows 24, each of which contains a plurality of photodiodes defining the pixels 26 arranged contiguously to form a pixel matrix or a pixel array. During operation of the X-ray panel 16, received X-ray radiation is converted to a lower energy form, and each of the photodiodes 26 has an initial charge that is depleted by an amount representative of the amount of X-ray radiation incident on the respective location of each photodiode 26. The data modules 18 are operable to read the amount of charge from each of the photodiodes 26. Each row 24 is scanned by the data modules 18 in conjunction with the scan modules 20 to read the amount of charge from all the pixels 26 in that row 24 (or column). The scan module 20 corresponding to a row 24 enables reading the pixels 26 in that row 24. When the pixel 26 is enabled for reading, the data module 18 corresponding to that pixel 26 reads the charge stored on the photodiode or pixel 26 by recharging the photodiode. Having read the charge value from the plurality of photodiodes 26, the data module 18 converts the charge value into a digital equivalent for further processing.

Figure 3:
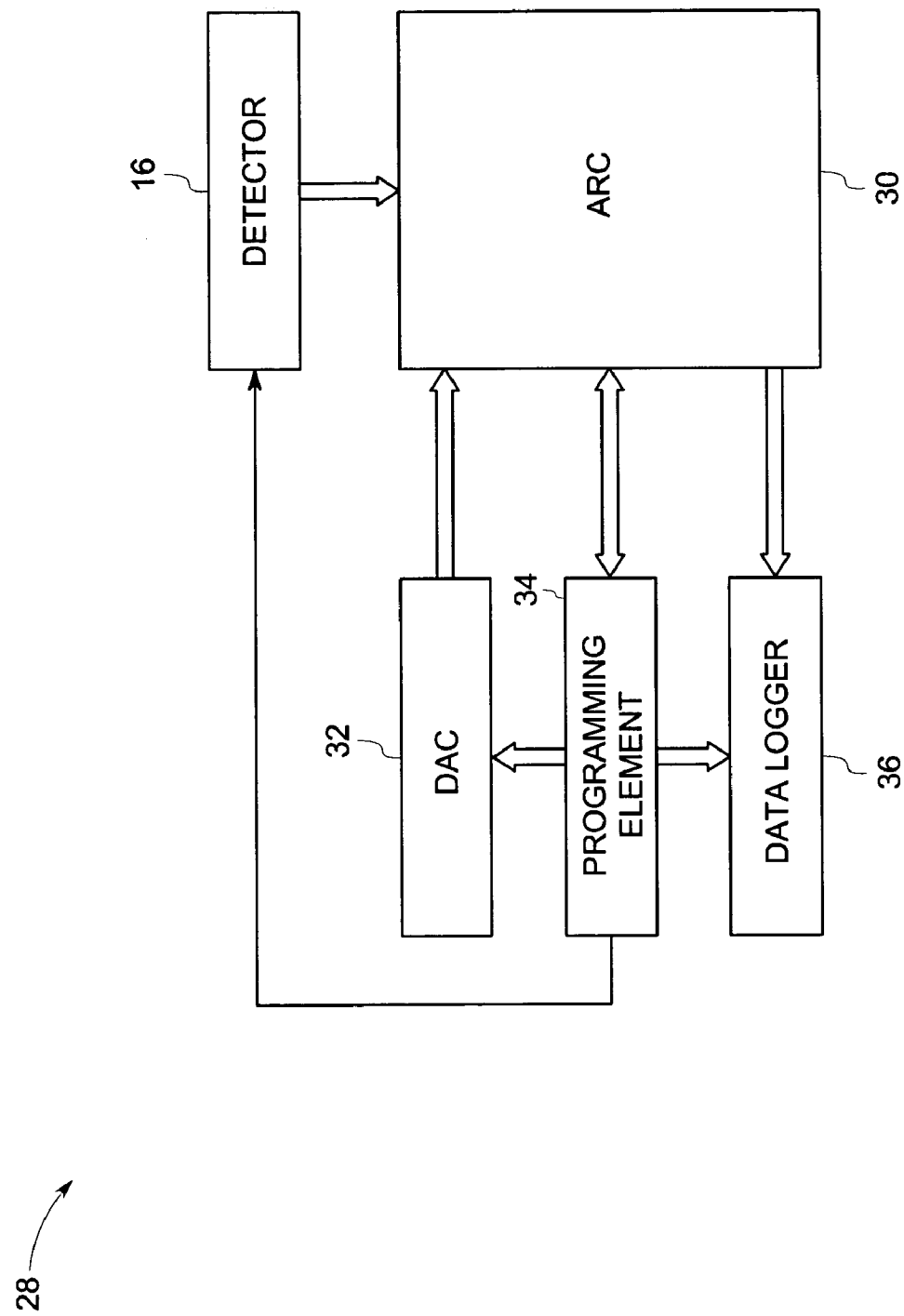
FIG. 3 is a diagrammatic view of an exemplary digital acquisition system for the digital X-ray panel shown in FIG. 2.

Turning now to FIG. 3, a diagrammatic view of an exemplary digital acquisition system 28 for the digital X-ray panel 16 of FIG. 2 is illustrated. The digital acquisition system 28 comprises an analog readout chip (ARC) 30, which comprises circuitry for reading the charge from (in practice the recharge to) the photodiodes 26 in the X-ray panel 16. The ARC 30 processes and digitizes the charge from the photodiodes 26. Detailed functionality of the ARC 30 will be explained later in the description. For facilitating digitization of the charge from the photodiodes 26, a digital-to-analog converter (DAC) 32 may be utilized. Driven by a counter, the DAC 32 provides a DAC output signal for circuitry in the ARC 30 to compare the charge values read from the photodiodes 26. The DAC output signal may define a linear portion and a polynomial portion, such as a linear portion, a quadratic portion, a cubic portion, and the like. The DAC output signal will be explained in further detail below.

In accordance with the present technique, the DAC output signal may be divided into segments to improve the speed of scanning an entire row 24 of pixels 26 and, consequently, the overall speed of digitizing the X-ray image. Therefore, a segment that comprises the location of charge value (input signal) may be desirably located. For locating a segment, segment-gain information may be required, which may be provided by a programming element 34. Moreover, other programmable options, such as dynamic bandwidth control and the data readout may be set by the programming element 34. A data logger 36 collects the digitized data from the ARC 30 and transmits the data to digital circuitry for image processing and reconstruction of a useful image.

Figure 4:
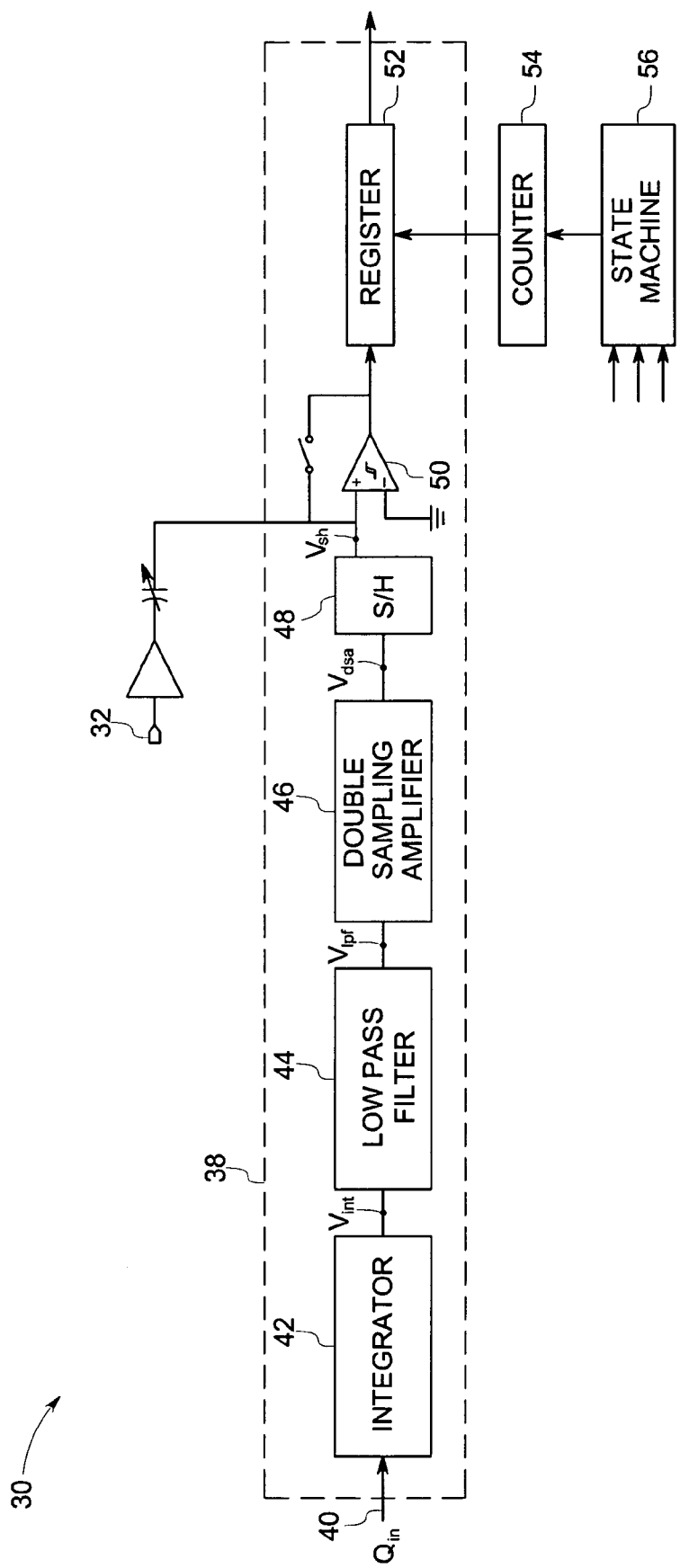
FIG. 4 is a diagrammatic view of an exemplary system shown in FIG. 3, in accordance with aspects of the present technique.

FIG. 4 is a diagrammatic view of the exemplary ARC 30 shown in FIG. 3, in accordance with aspects of the present techniques. ARC 30 comprises a plurality of channels 38, each being operable to read the charge value from a photodiode or pixel 26 and to provide the digital equivalent. The DAC 32 is common to all the channels 38, so that the DAC 32 provides the DAC output signal to each of the channels 38, which respectively compare the charge value with the common DAC output signal. An input signal 40, which may comprise a charge value from a photodiode or pixel 26, is provided to the channel 38, as illustrated. The input signal 40 may moreover comprise voltage values, current values, temperature data, etc. that is to be digitized. In other words, the input signal 40 may include any analog quantity requiring digitization. Each channel comprises an integrator 42, which integrates the input signal 40 (charge value $Q_{in}$) for conversion into an equivalent voltage value, $V_{int}$, which is fed into a low-pass-filter 44 for reducing noise. Voltage signal outputted from the low-pass-filter 44, $V_{lpf}$, is fed into a double sampling amplifier 46, which provides a desirable gain to $V_{lpf}$. The output of the double sampling amplifier 46, $V_{dsa}$, is sampled and held in sample and hold (S/H) circuitry 48. The double sampling amplifier 46 in conjunction with the low-pass-filter 44 provides correlated double sampling process to reduce offset and flicker noise. Integrator 42, low-pass-filter 44, and double sampling amplifier 46 together form an analog front-end. The analog front-end may therefore be decoupled from the rest of the channel 38 by the S/H circuit 48. Pipelined conversion is thus achieved by the use of the S/H circuit 48.

The output of the S/H circuit 48, $V_{sh}$, and the DAC output signal provided by the DAC 32 may be fed as input into a comparator 50 for comparison. The comparator 50 provides either a high or a low output based on the comparison of $V_{sh}$ and the DAC output signal provided by the DAC 32. The channel 38 also comprises a register 52, which is provided with a counter value from a counter 54. The counter value provided by counter 54 is proportional to the digital code provided to the DAC 32 for generating the DAC output signal. The output of the comparator 50 may be configured to freeze the counter value in the register 52 when the output of the S/H circuit 48 and the DAC output signal provided by the DAC 32 are equal. Because the counter value provided to DAC 32 and register 52 are proportional, the frozen counter value in the register 52 is representative of the digitized output of the input signal (charge value) of the corresponding pixel 26 read by channel 38.

A state machine 56 may be utilized to synchronize the counter 54 and the count value provided to the DAC 32 at any instant. It may be noted that the integrator 42, low-pass-filter 44, double sampling amplifier 46, S/H circuit 48, comparator 50 and register 52 comprise a single channel 38 that reads a single photodiode or pixel 26. In one embodiment, there are thirty-two different channels 38 hard-wired into a single ARC 30. DAC 32 is common to the entire system. Counter 54 and state machine 56, however, are separate components, within the ARC 30 that are common to all thirty-two channels 38.

Figure 5:
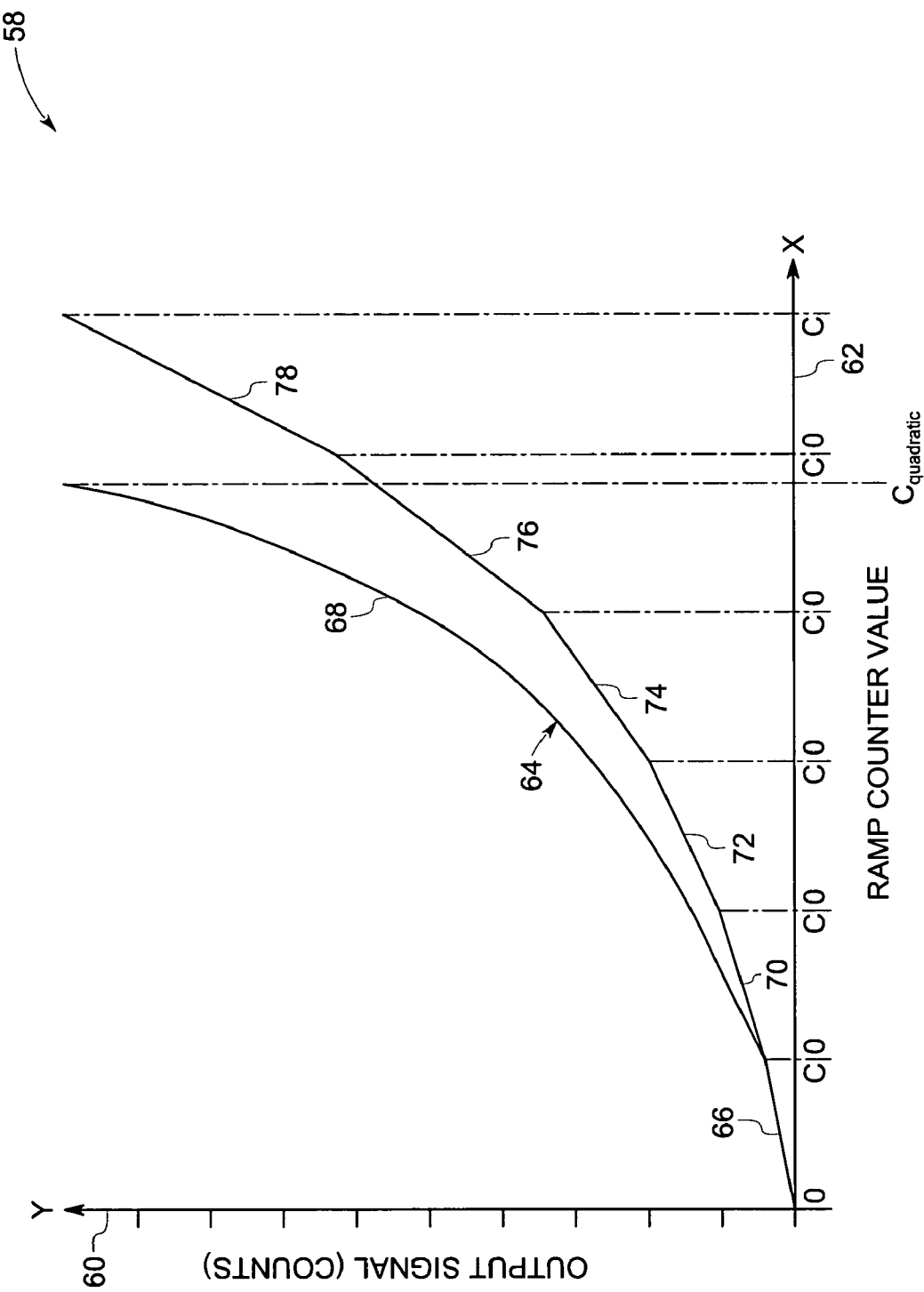
FIG. 5 is a graphical view of a path followed by the DAC output signal, illustrating a segmentation process in accordance with aspects of the present technique.

Referring now to FIG. 5, a graphical illustration 58 of a path followed by the DAC output signal is shown. The illustration 58 shows the output signal values, in counts, on the y-axis 60 plotted against ramp counter values on the x-axis 62. The ramp counter value 62 is proportional to the digital code values that are fed into the DAC 32 for generating the DAC output signal that follows a linear-polynomial ramp 64. Therefore, the DAC output signal increases in steps or counts. The linear-polynomial ramp 64 defined by the DAC output signal begins with a linear portion 66 until a desirable ramp counter value C. Beyond ramp counter value C, the ramp may advantageously define a polynomial portion 68 for improvement of signal-to-noise ratio of the digital output of the scanned X-ray image.

In one specific embodiment, the linear-polynomial ramp 64 may define a linear portion 66 followed by a quadratic portion 68, and may be therefore termed as a linear-quadratic ramp. Furthermore, the polynomial portion 68 may define a cubic curve, or other polynomial curves that may be advantageously employed. The particular relationship between the input and output (count) values may follow other profiles and relations in other applications. Moreover, the segmentation of the relationship, as described below, may result in more or fewer segments than those described here, and will typically result in different offsets and gains (slopes) for each segment, also as described below.

Referring back to FIG. 4, the output of the S/H circuit 48 is provided to the comparator 50. The value of the DAC output signal is checked against $V_{sh}$. If the DAC output signal at that instant is not equal to the output of the S/H circuit 48, the ramp counter value that provides counts to the DAC 32 and the register 52 is increased to the next count value. The linear-polynomial relationship (linear-quadratic, linear-cubic, etc.) between the ramp counter and the digital code may be appropriately implemented based on the applications. For example, for the linear portion, the ramp counter and the digital code to the DAC may be equal. Beyond a certain ramp counter value, e.g. C in FIG. 5, the relationship may be polynomial. The ramp counter in FIG. 5 and the counter 54 in FIG. 4 increment linearly. However, the digital code provided to the DAC 32 and the resulting analog signal will be linear-polynomial. When the DAC output signal becomes equal to $V_{sh}$, the comparator 50 provides a signal that freezes the counter value residing in the register 52. Therefore, the register 52 contains a digital value corresponding to the input signal from the respective channel (i.e., the charge value for the photodiode or pixel 26 of FIG. 2 in the X-ray system implementation). By applying the relationship between the DAC digital code and the ramp counter value, an equivalent DAC digital code to the counter value yields the charge value stored on the photodiode 26.

The graphical illustration 58 further shows a segmentation process for achieving a higher signal conversion rate. Segmentation may be achieved by using the generally linear portion 66, and transforming it to generate portions of the polynomial portion 68. In other words, counter values provided to the DAC 32 follow a linear ramp, until the ramp counter value C, hereinafter referred to as the base ramp 66. The base ramp 66 is common to the entire ramp 64. The remaining portions of the curve 64 may be generated within the ARC 30 on a channel-by-channel basis by applying gain and offset values to the base ramp 66.

Moreover, while digitizing the input signal 40, the ARC 30 may coarsely compare $V_{sh}$ against ramp count values C, 2C, 3C, 4C, and 5C, to determine a segment (or a range) in which the digital value of the input signal 40 is located. Once a segment is identified as having the digital equivalent of the output of S/H circuit 48, the base ramp 66 received by the corresponding channel 38 is manipulated by applying gain and offset values to recreate that segment. A fine A/D conversion similar to that described previously with respect to linear-polynomial ramp 64, may then be performed. For example, counts between 2C and 3C may be compared against the output of S/H circuit 48, such that the counts follow the path defined by segment 72. Such an auto-ranging process enhances the speed of A/D conversion. It may be noted that any of the segment to be traced, 70, 72, 74, 76, and 78, could be generated using a base ramp 66, and by adding an offset and multiplying by a gain value. This may be performed to achieve the desired linear portion in the corresponding segment, which has the desired starting value and slope. In general, then, a segment i can be described by the following equation:

$$V(i) = V_{offset}(i) + \text{Gain}(i) * V_{base}$$

where, V(i) is the desired output voltage for comparison in segment i;

$V_{base}$ is the base voltage of linear portion 66;

Gain(i) is the gain value, which is multiplied to base voltage $V_{base}$ to transform $V_{base}$ to the desired slope in segment i; and $V_{offset}(i)$ is the offset voltage that is added to Gain(i)*$V_{base}$ to reach segment i.

It will be understood by those skilled in the art that the base ramp, which in the above example is the generally linear portion 66 of the linear-polynomial ramp 64, may lie in any of the segments. In other words, if the generally linear portion 66 lies in the middle of the linear-polynomial ramp 64, then the offset voltage $V_{offset}(i)$ corresponding to a segment i in the left of the base ramp would be negative.

Figure 6:
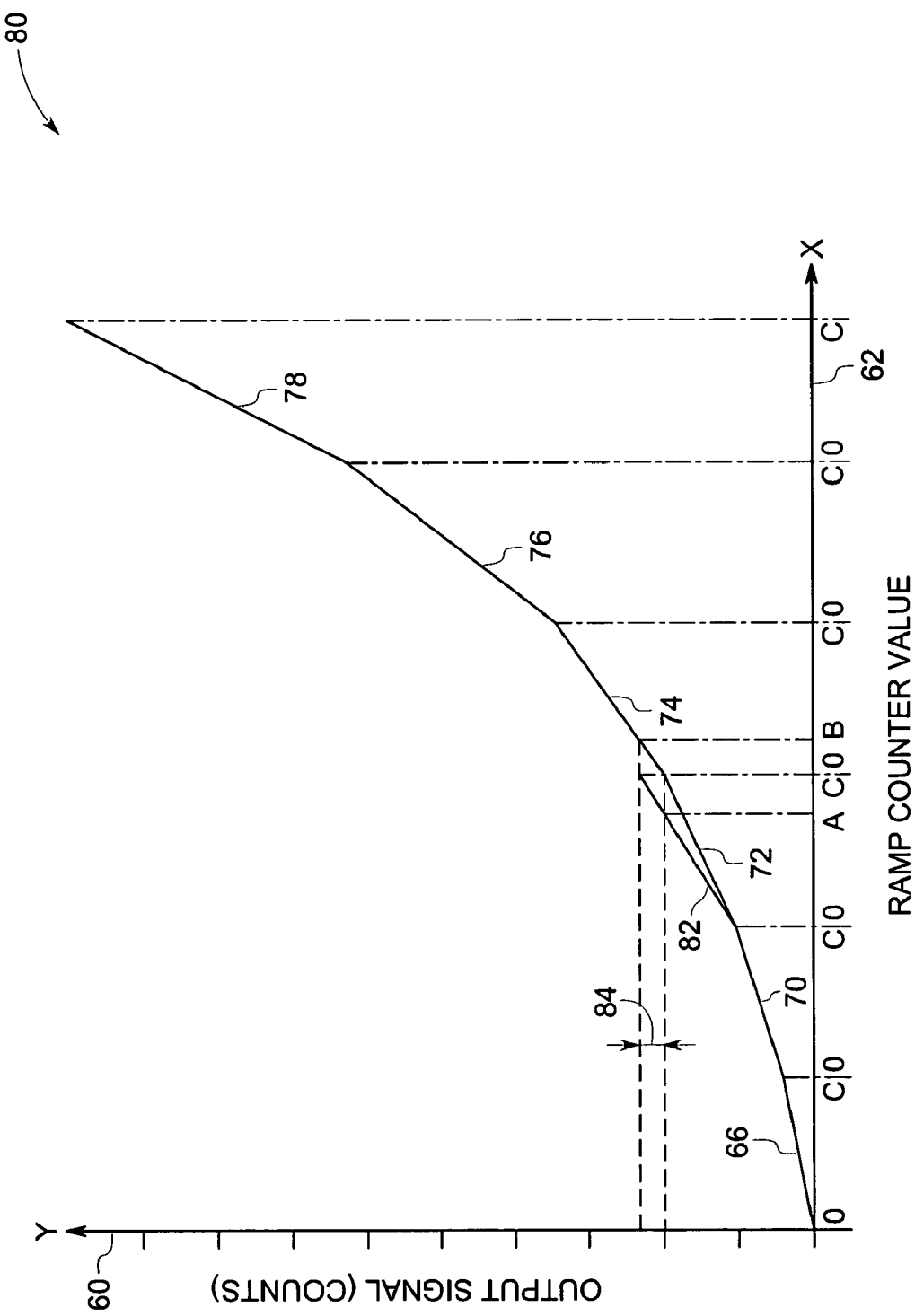
FIG. 6 is a graphical view of the path traced by the DAC output signal shown in FIG. 5, illustrating an overlap band resulting from a non-ideal gain variation.

Referring now to FIG. 6, a graphical illustration 80 of the path followed by the DAC output signal shown in FIG. 5, illustrating an overlap band resulting from non-ideal gain estimation is shown. As illustrated, if the slope of segment 72 is greater than desired, the base ramp 66 may assume a path 82 in that segment. In other words, due to a greater value of gain than desired, the slope may increase from the desirable slope. This higher value of gain (slope) manifests itself as an overlap band 84, resulting in redundancy in signal range. For example, an analog input signal 40 between ramp count values A and C in segment 82 and an analog input signal 40 between ramp count values 0 and B in segment 74 may have the same digital equivalent.

Figure 7:
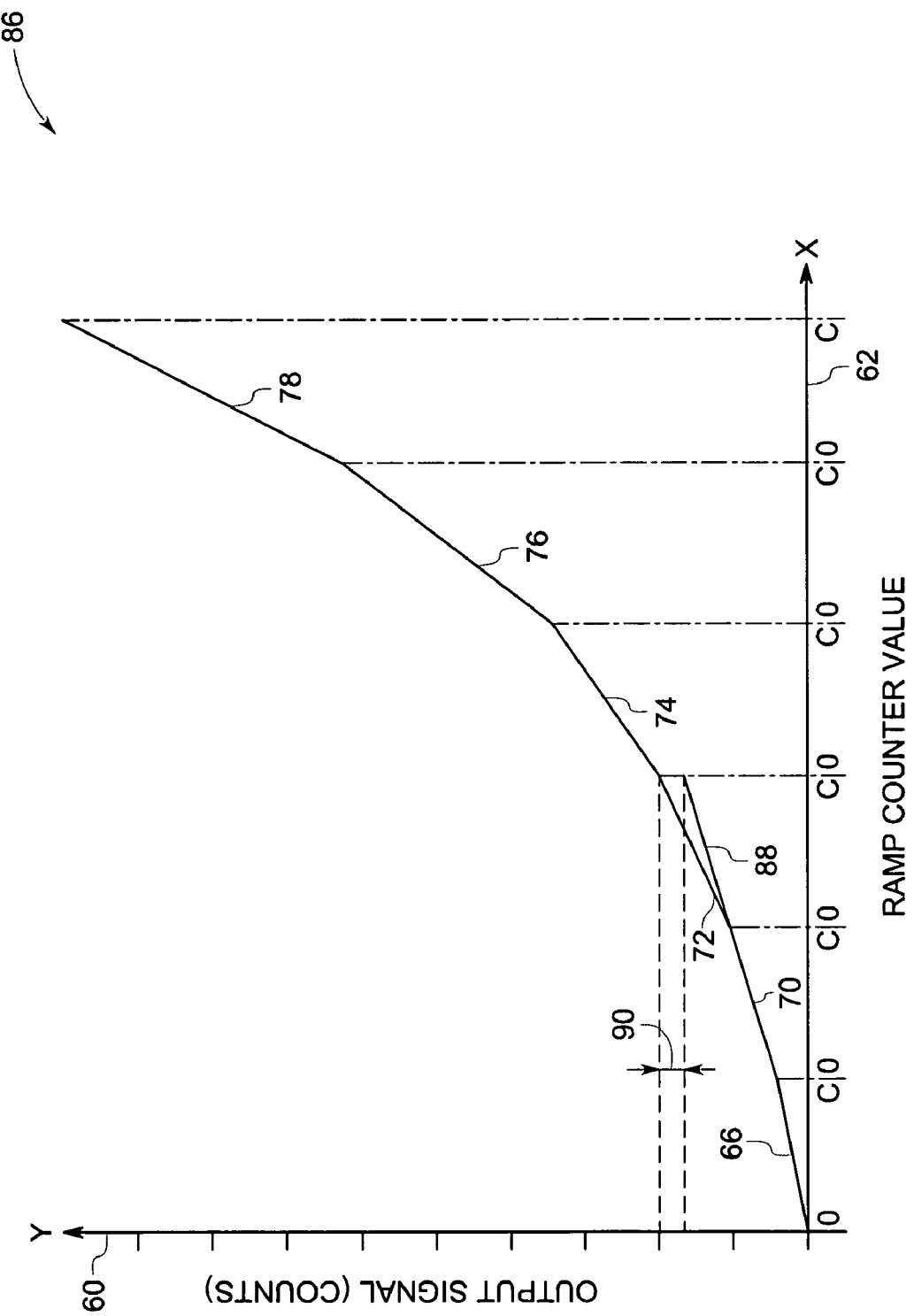
FIG. 7 is a graphical view of the path traced by the DAC output signal shown in FIG. 5, illustrating a dead band resulting from a non-ideal gain variation.

Turning now to FIG. 7, a graphical illustration 86 of the path followed by the DAC output signal shown in FIG. 5, illustrating a dead band resulting from non-ideal gain estimation is shown. When the slope of segment 72 is smaller than desired, the base ramp 66 may assume a path 88 in that segment. Therefore, due to a smaller value of gain than desired, the slope decreases from the desirable slope. The lower value of gain (slope) manifests itself by producing a dead band 90, resulting in erroneous digitization at the transition between segments 88 and 74, and loss of information.

Figure 8:
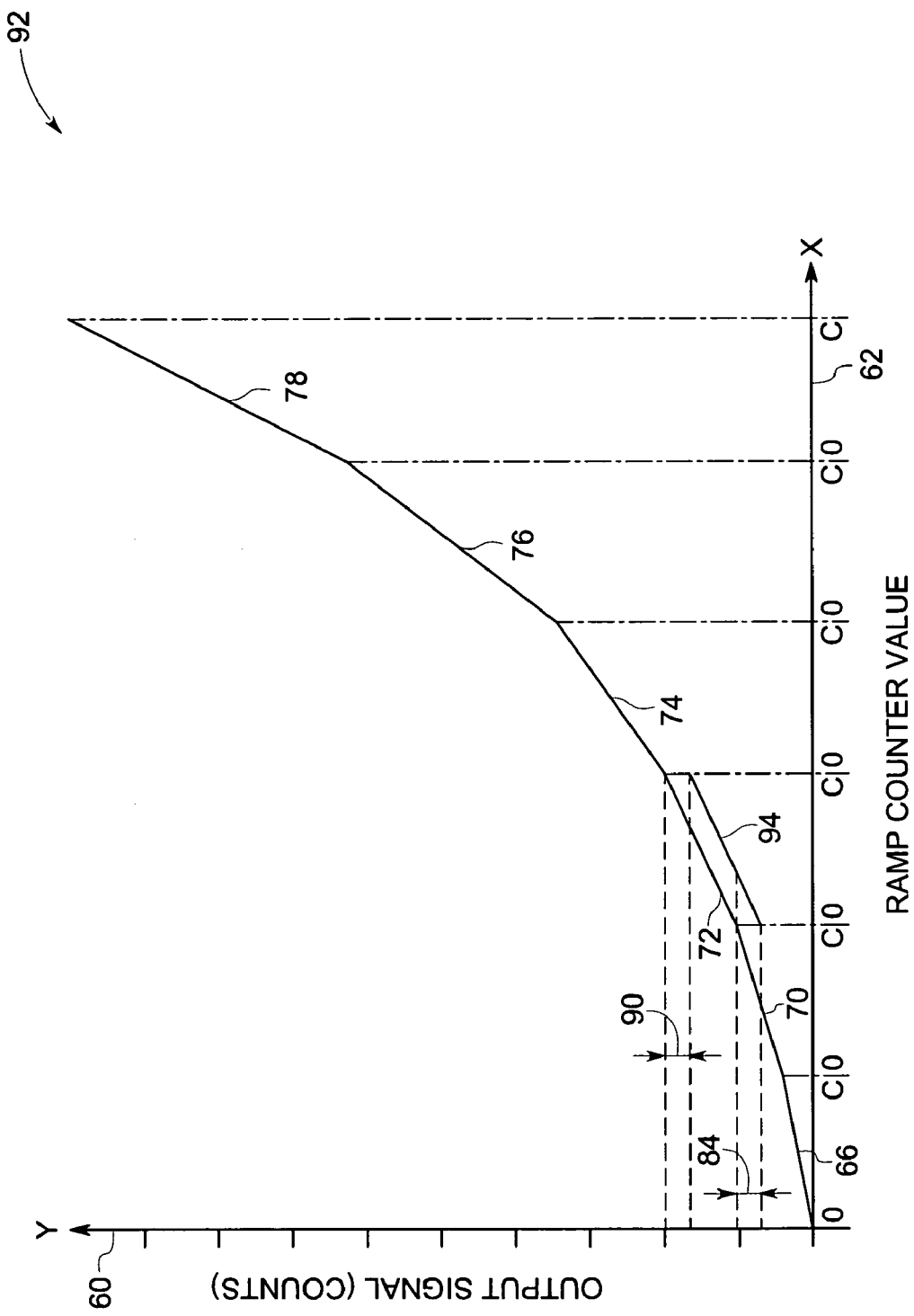
FIG. 8 is a graphical view of the path traced by the DAC output signal shown in FIG. 5, illustrating an overlap band and a dead band resulting from a non-ideal offset variation.
Figure 9:
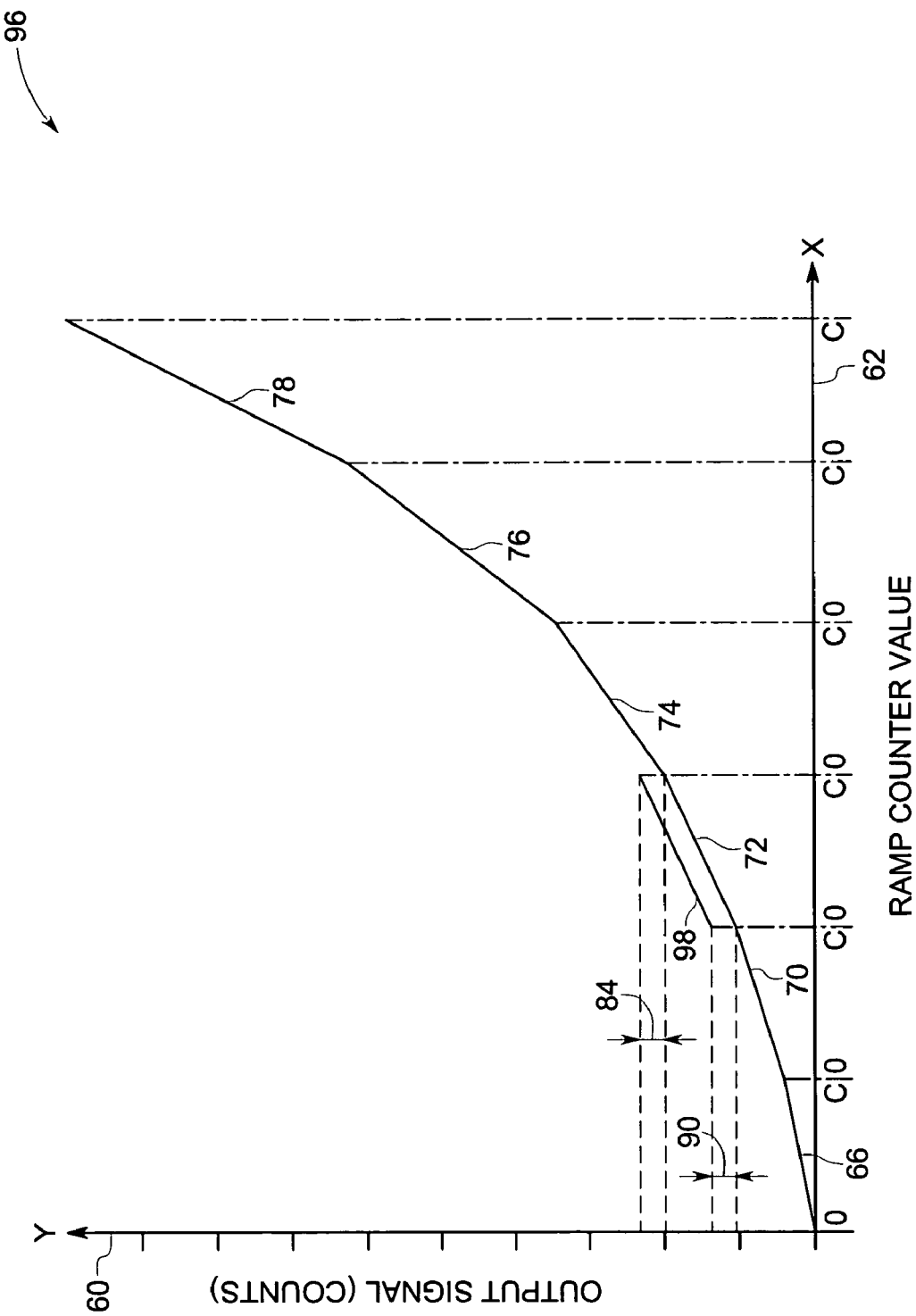
FIG. 9 is a graphical view of the path traced by the DAC output signal shown in FIG. 5, illustrating an overlap band and a dead band resulting from non-ideal offset variation.

Referring generally to FIGS. 8 and 9, overlapped and dead bands resulting from non-ideal offset variation is shown. In particular, in graphical illustration 92 shown in FIG. 8, when the offset value for a segment 72 is incorrectly estimated, the base ramp 66 may assume a path 94 in that segment. This may result in both overlap band 84 and dead band 90. Similarly, in graphical illustration 96 shown in FIG. 9, an incorrect estimation of the offset value for the segment 72 results in the base ramp 66 assuming a path 98 in that segment. This may again result in both overlap band 84 and dead band 90.

Figure 10:
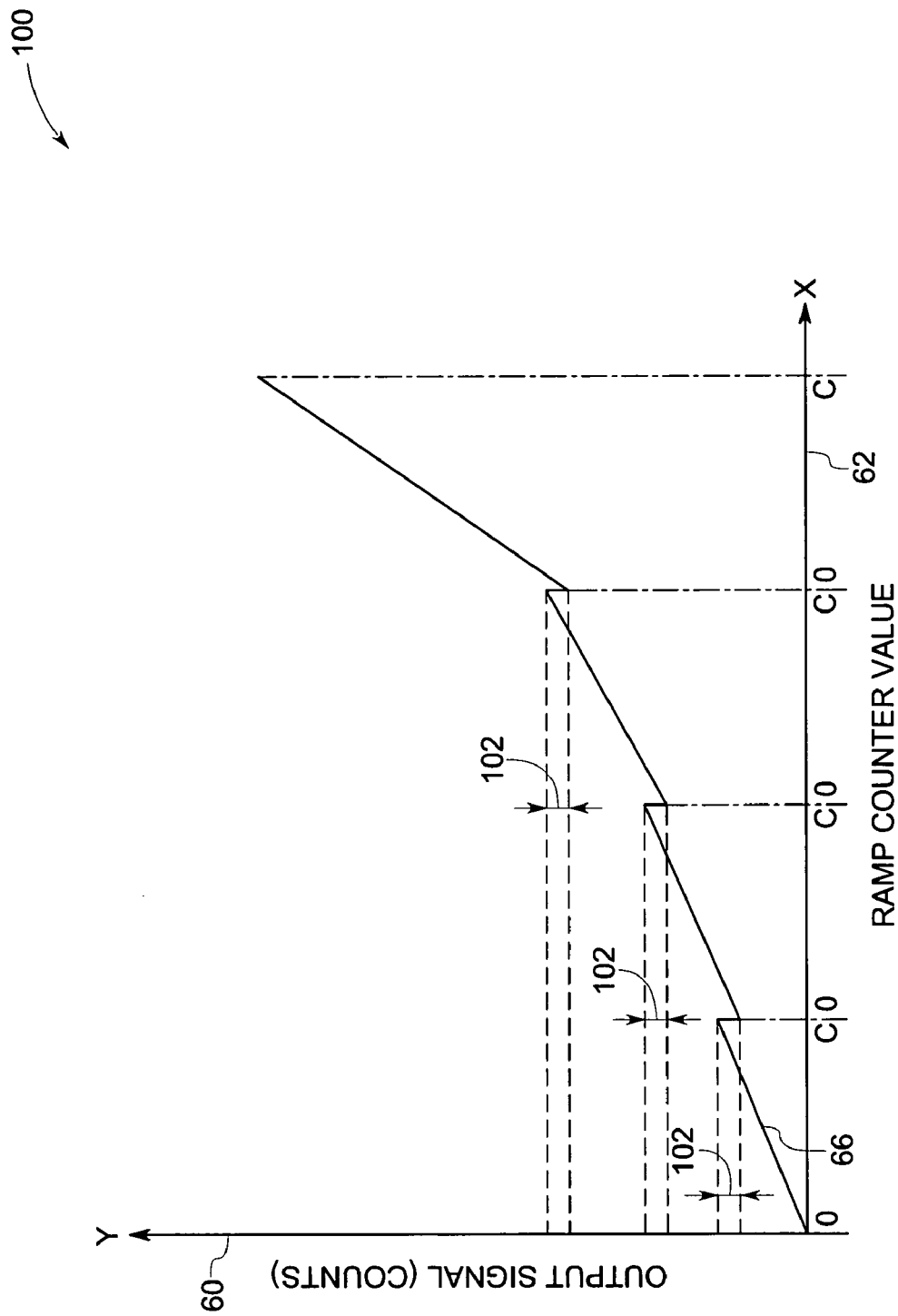
FIG. 10 is a graphical illustration of the segmented linear-polynomial path followed by the DAC output signal in accordance with aspects of the present technique.

FIG. 10 is a graphical illustration 100 of the segmented linear-polynomial path followed by the DAC output signal.

As illustrated, after every C counts, the DAC output signal assumes a linear segment that conforms to the linear-polynomial path 64. As described previously, with reference to FIGS. 6–9, non-optimal gain values or non-ideal implementation of offset values provided during transformation of the base ramp 66 to the desired segment may result in overlap or dead bands. Such effects may provide erroneous digital output of the charge value $Q_{in}$ 40. It may be noted that this overlapping effect may be corrected digitally. However, signal loss due to a dead band may not be easily recoverable. By providing sufficient overlap 102 between segments, dead zones caused by capacitor mismatches, offset errors, and other chip processing imperfections may be avoided.

Figure 11:
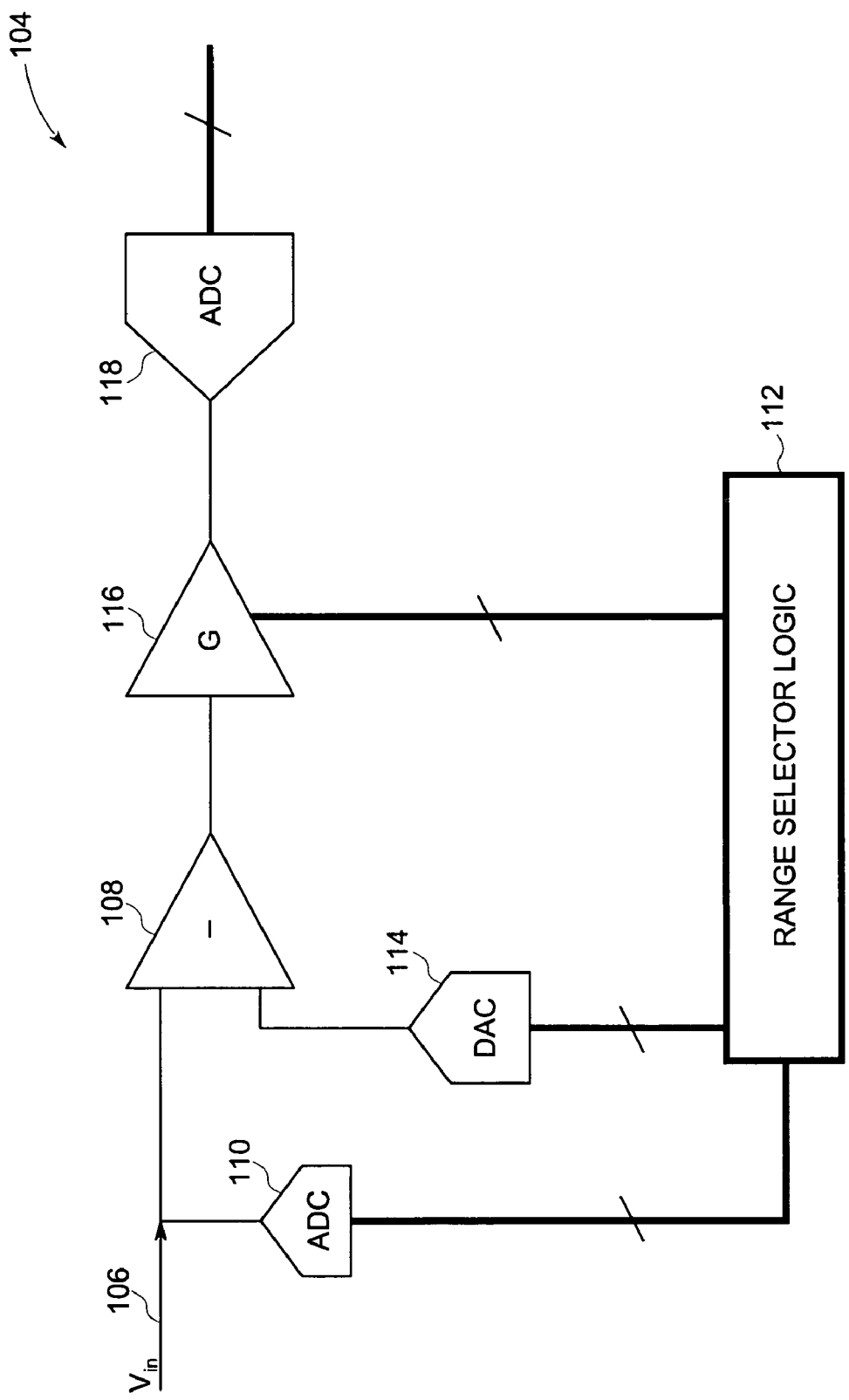
FIG. 11 is a diagrammatic view of an exemplary data acquisition system for implementing the segmented linear-polynomial path shown in FIG. 10 in the digital X-ray panel of FIG. 2 in accordance with aspects of the present technique.

FIG. 11 is a diagrammatic view of an exemplary data acquisition system 104 for implementing the segmented linear-polynomial path shown in FIG. 10 in the digital X-ray panel of FIG. 2. The data acquisition system 104 is a simplified adaptation of the digital acquisition system 28 shown in FIG. 3, with modifications to provide the segmented linear-polynomial path shown in FIG. 10. An analog input signal $V_{in}$ 106 that is to be digitized is fed into a subtractor 108 and a range finder (or a coarse A/D converter) 110. The range finder 110 performs a coarse A/D conversion and feeds the information into a range selector logic circuitry 112.

The range selector logic circuitry 112 drives an offset generator 114 and variable gain generator 116. The offset generator 114 calculates the offset value $V_{offset}(i)$ for this $i^{th}$ segment that would transform the base ramp 66 to the determined segment. The offset value $V_{offset}(i)$ is then fed into the subtractor 108, which also receives the input signal $V_{in}$ 106. The subtractor 108 provides a difference between the input signal $V_{in}$ 106 and the offset value $V_{offset}(i)$, i.e. $V_{in}-V_{offset}(i)$. The subtraction of the offset value from the input signal $V_{in}$ 106, for a given segment i has a normalizing effect on the analog signal. This facilitates realization of gain values that are related with the gain values of other segments.

The variable gain generator 116 generates the appropriate gain value Gain(i) for the $i^{th}$ segment. This gain value Gain(i) is applied to the output $V_{in}-V_{offset}(i)$ of the subtractor 108. The output amplified with the gain value, i.e. Gain(i)*($V_{in}-V_{offset}(i)$) is fed into a digitizer (or a fine A/D converter) 118. The digitizer 118 provides the digital equivalent of the analog input signal $V_{in}$ 106.

In general, then, the digital equivalent of the analog input signal $V_{in}$ 106 for the $i^{th}$ segment can be described by the following equation:

$$\text{Gain}(i) * (V_{in} - V_{offset}(i)) = N * V_{lsb}$$

where, $V_{in}$ is the analog input signal 106 for comparison in a given channel;

N is the digitized number; and $V_{lsb}$ is the least significant bit of the digitizer 118.

Figure 12:
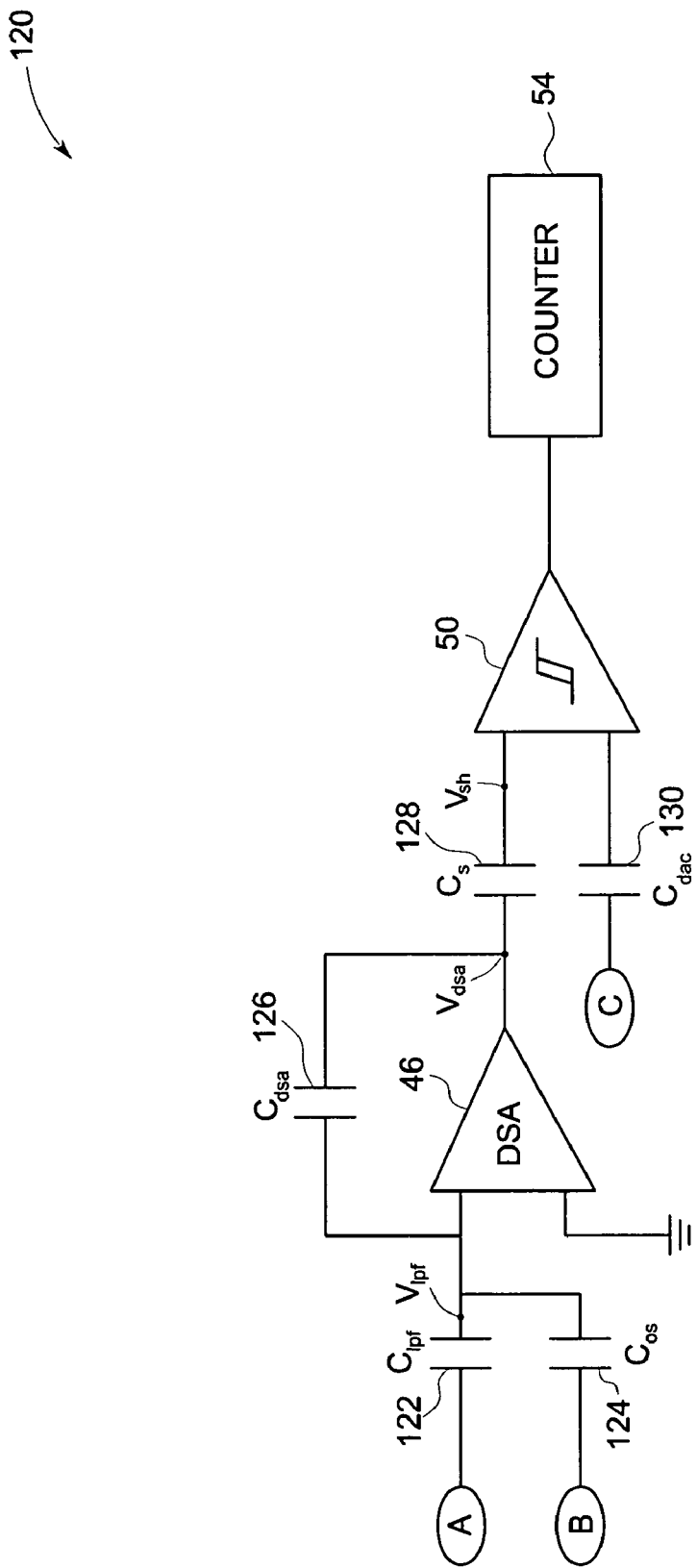
FIG. 12 is a diagrammatic view of an exemplary system shown in FIG. 11 in accordance with aspects of the present technique.

Referring generally to FIG. 12, a diagrammatic view of an architecture 120 of the data acquisition system of FIG. 11 is shown. The illustrated architecture 120 is a simplified adaptation of the data acquisition system 104 of FIG. 11. Architecture 120 shows three nodes A, B, and C. At node A, the analog input signal $V_{in}$ 106 is applied, while at node B, the offset value is applied. At node C, the ramp signal tracing the linear-polynomial path is applied. $C_{lpf}$ 122 is the equivalent capacitance of the low-pass-filter 44; $C_{os}$ 124 is the equivalent offset capacitance; and $C_{dsa}$ 126 is the equivalent capacitance of the double sampling amplifier 46.

For calibration, accurate values of gain and offset may be determined. The transfer function of the architecture 120 may be defined as follows:

$$V_{in} = \alpha_{seg} * N_{rampcnt} + \beta_{seg} * M_{offset}$$

where, $\alpha_{seg}$ is the attenuation due to the comparator 50;

$N_{rampcnt}$ is the counter value at which the counter 54 tripped;

$\beta_{seg}$ is the gain due to double sampling amplifier 46 on output of comparator 50, when an offset input is applied at node B; and $M_{offset}$ is the digital code of offset value, applied by DAC 32.

However, from FIG. 12, transfer function of the architecture 120 may be computed as follows:

$$\left(\frac{V_{in}}{C_{int}}\right) * \left(\frac{C_{lpf}}{C_{dsa}}\right) * C_s - M_{offset} * V_{lsb} * \left(\frac{C_{os}}{C_{dsa}}\right) * C_s = N_{rampcnt} * V_{lsb} * C_{dac}$$

where, $C_{int}$ is the equivalent capacitance of integrator 42;

$C_s$ is the equivalent capacitance of a sampling capacitor 128;

$C_{dac}$ 130 is the equivalent capacitance of DAC 32.

From the above equation, $V_{in}$ 106 may be computed as follows:

$$V_{in} = C_{int} * V_{lsb} * \left[\left(\frac{C_{dac}}{C_{lpf}}\right) * \left(\frac{C_{dsa}}{C_s}\right) * N_{rampcnt} + \left(\frac{C_{os}}{C_{lpf}}\right) * M_{offset}\right]$$

or, $V_{in} = C_{int} * V_{lsb} * [\alpha_{seg} * N_{rampcnt} + \beta_{seg} * M_{offset}]$.

Comparing the above equation with $V_{in} = \alpha_{seg} * N_{rampcnt} + \beta_{seg} * M_{offset}$, $\alpha_{seg}$ and $\beta_{seg}$ may be determined as below:

$$\alpha_{seg} = \left(\frac{C_{dac}}{C_{lpf}}\right) * \left(\frac{C_{dsa}}{C_s}\right);$$

$$\beta_{seg} = \frac{C_{os}}{C_{lpf}}.$$

For offset calibration, a reference voltage $V_{ref}$ is applied to node A, while tuning the offset capacitance $C_{os}$ 124 to zero. Alternatively, a signal value of zero may be applied at node B. The linear ramp provided by the DAC 32 is applied at node C. The signal applied at node A is amplified by the double sampling amplifier 46 and is sampled at the sampling capacitor $C_s$ 128. This sampled signal $V_{sh}$ is compared with the linear ramp, provided by the DAC 32 from node C, at the comparator 50. When the linear ramp signal from DAC 32 becomes equal to the sampled signal $V_{sh}$, comparator 50 trips (i.e., is actuated). The digital equivalent $N_1$ of the reference voltage $V_{ref}$ is therefore registered in the counter 54, and is given by the following equation:

$$V_{ref} * \left(\frac{C_{lpf}}{C_{dsa}}\right) * C_s = (N_1 + INL_{e1}) * V_{lsb} * C_{dac}.$$

Again, the reference voltage $V_{ref}$ is applied to nodes A and B, which provides $N_2$ as the digital equivalent of the reference voltage $V_{ref}$. The accuracy of offset coefficient may then be determined by a non-linear error INL spread around $N_1$ and $N_2$, as follows:

$$V_{ref} * \left[ \left( \frac{C_{lpf}}{C_{dsa}} \right) * C_s - \left( \frac{C_{os}}{C_{dsa}} \right) * C_s \right] = (N_2 + INL_{e2}) * V_{lsb} * C_{dac}$$

where, $INL_{e1}$ is the error in computing $N_1$; and $INL_{e2}$ is the error in computing $N_2$.

From the above equation, $\beta_{seg}$ may be computed as given below:

$$\beta_{seg} = \frac{C_{os}}{C_{lpf}}$$

$$\therefore \beta_{seg} = \frac{N_1 - N_2}{N_1}$$

In one embodiment, the division of $$\frac{N_1 - N_2}{N_1}$$

may be realized efficiently and easily via a shift operation, such as Taylor series expansion. Taylor series expansion may be utilized when $N_1$ is a power of two (2), such as $16384=2^{14}$. By employing Taylor series expansion, we may express $$\frac{1}{N_1} = \frac{1}{2^k} * \left( 1 + \frac{y}{2^k} \right).$$

Thus, Taylor series expansion utilizes a shift operation to obviate division of two numbers, thereby minimizing power and storage problems associated with division of two numbers. Therefore, the division is performed as a shift operation, where y represents the difference between the nominal $N_1$ and measured $N_1$.

$$\therefore \beta_{seg} = (N_1 - N_2 + INL_{e1} - INL_{e2}) * 2^{-N} * \left( 1 - \frac{y}{2^N} - \frac{INL_{e1}}{2^N} \right);$$

where $-127 \leq y \leq 127$
and $$\frac{1}{N_1 + INL_{e1}} = 2^{-N} * \left( 1 - \frac{y}{2^N} - \frac{INL_{e1}}{2^N} \right)$$

using Taylor series expansion. It may be noted that in this embodiment, y has 255 different values, or in other words y is bound within ±127. Thus, the operand $$\left( 1 + \frac{y}{2^k} \right)$$

may be pre-calculated for each of the 255 values and stored in a segment map, as will be explained later in the description. Such a segment map facilitates lower consumption of power and yields faster computation, and therefore, higher throughput for the digital conversion process.

For computing gain value accurately, node B is grounded and the channel gain is set to $G_1$. Reference voltage $V_{ref}$ is applied to node A, while linear ramp signal provided by the DAC 32 is applied at node C. The reference voltage signal $V_{ref}$ is amplified by the double sampling amplifier 46 and is sampled at the sampling capacitor $C_s$ 128. This sampled signal $V_{sh}$ is compared with the linear ramp signal, provided by the DAC 32 from node C, at the comparator 50. When the linear ramp signal from DAC 32 becomes equal to the sampled signal $V_{sh}$, comparator 50 is actuated. The digital equivalent $N_1$ of the reference voltage $V_{ref}$ is therefore registered in the counter 54, and is given by the following equation:

$$V_{ref} * G_1 = (N_1 + INL\varepsilon_1) * V_{lsb} = 2^N * \left( 1 + \frac{y_1}{2^N} + \frac{INL\varepsilon_1}{2^N} \right) * V_{lsb}.$$

In a second step, the channel gain is set to $G_2$, wherein $$G_k = \frac{G_1}{2^k}$$

and k=1, 2, 3, and so forth. The reference voltage $V_{ref}$ is applied to node A and linear ramp signal provided by the DAC 32 is applied at node C. When the comparator 50 is actuated, the digital equivalent $N_2$ of the reference voltage $V_{ref}$, is recorded as under:

$$V_{ref} * G_2 = (N_2 + INL\varepsilon_2) * V_{lsb} = N_2 * \left( 1 + \frac{y_2}{N_2} + \frac{INL\varepsilon_2}{N_2} \right) * V_{lsb}.$$

Similarly, other gain values may be computed, by utilizing a generalized equation of the above represented by:

$$V_{ref} * G_2 = (N_2 + INL\varepsilon_2) * V_{lsb} = N_{2nom} * \left( 1 + \frac{y_2}{N_{2nom}} + \frac{INL\varepsilon_2}{N_{2nom}} \right) * V_{lsb}$$

where, $$N_{2nom} = \frac{N_1}{2^k} = 2^{N-k} \left( 1 + \frac{y_1}{2^N} + \frac{INL\varepsilon_1}{2^N} \right); \text{ and } G_{2nom} = \frac{1}{2^k} G_{1nom},$$

where k=1, 2, 3, and so forth.

Further, from the above equations, $$\frac{G_2}{G_1} = \frac{N_2}{N_1} = \frac{1}{2^k}\left(1 + \frac{y_2}{2^{N-k}} - \frac{y_1 y_2}{2^{2N-k}} + \frac{INL\varepsilon_2}{2^{N-k}} + \ldots\right);$$

where $-127 \leq y_1, y_2 \leq 127$ $INL_{\varepsilon 1}$ is the error in computing $N_1$; and $INL_{\varepsilon 2}$ is the error in computing $N_2$.

This approach cancels the errors caused by reference voltage $V_{ref}$.

In an alternative approach, $N_1$ and $N_2$ are recorded as under:

$$V_{ref} * G_1 = (N_1 + INL\varepsilon_1) * V_{lsb} = 2^N * \left(1 + \frac{y_1}{2^N} + \frac{INL\varepsilon_1}{2^N}\right) * V_{lsb}$$

and $$V_{ref} * G_2 = (N_2 + INL\varepsilon_2) * V_{lsb}.$$

From the above equations, $$\frac{G_2}{G_1} = \frac{N_2}{N_1} = \frac{(N_2 + INL\varepsilon_2)}{2^N} * \left(1 - \frac{y_1}{2^N} - \frac{INL\varepsilon_1}{2^N}\right);$$

where $-127 \leq y_1, y_2 \leq 127$;

$INL_{\varepsilon 1}$ is the error in computing $N_1$; and $INL_{\varepsilon 2}$ is the error in computing $N_2$. Again, this approach cancels the errors caused by reference voltage $V_{ref}$.

The abovementioned approaches allow computation of $G_2$ by measuring $$\frac{G_2}{G_1}$$

and using the corrected $$G_1 \text{ as } G_2 = G_1 * \left(\frac{G_2}{G_1}\right).$$

Similarly, the same methodology may be utilized to calculate $G_3$, $G_4$, and so forth. This gain calibration method relaxes the linearity range for the DAC 32 that is used to generate the calibration analog signal.

Figure 13:
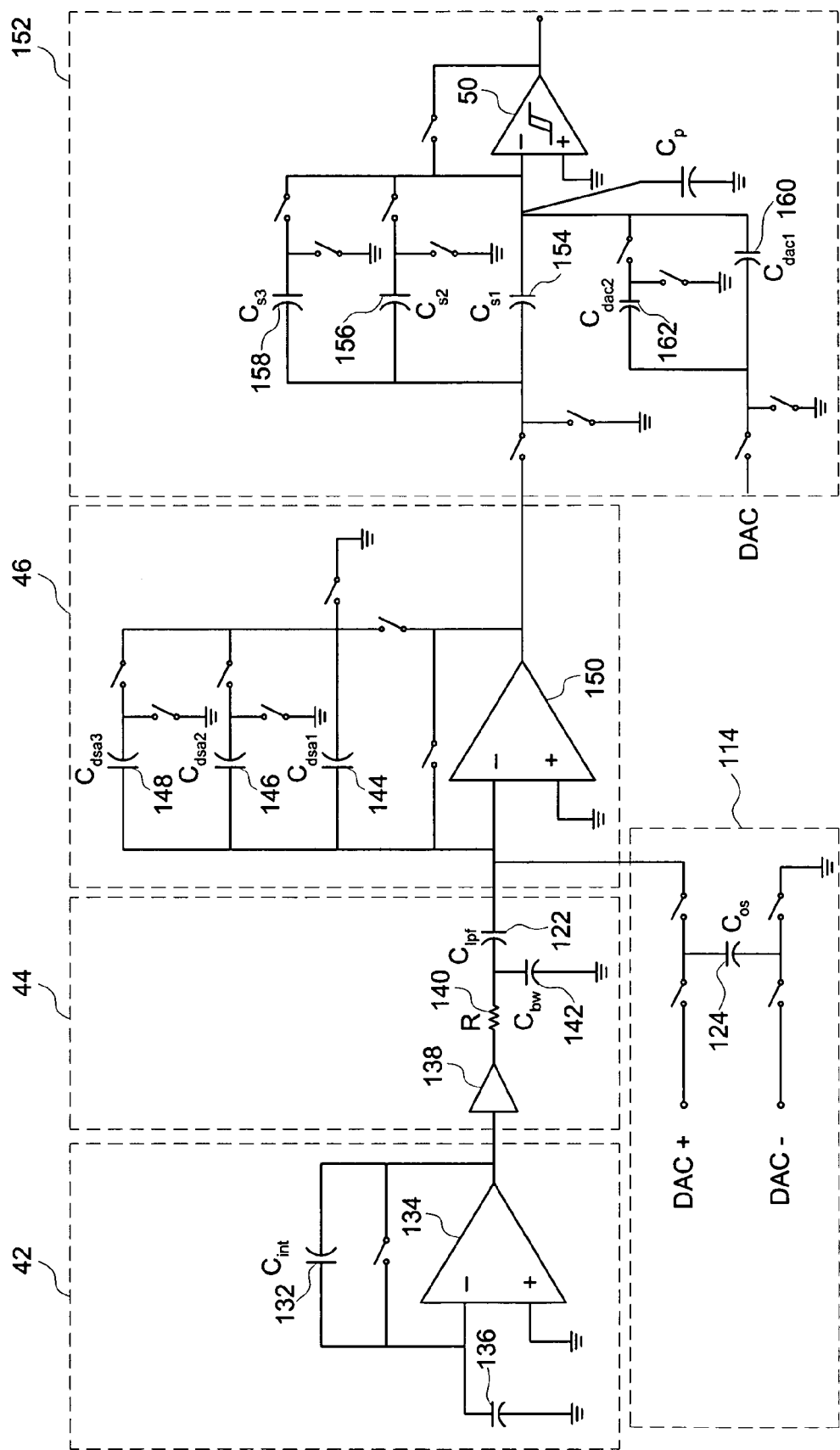
FIG. 13 is a detailed diagrammatic view of the architecture of the system shown in FIG. 11.

FIG. 13 is a detailed diagrammatic view of the architecture of the system shown in FIG. 11. The charge value $Q_{in}$ 40 from the detector 16 is fed to the integrator 42 comprising an integration capacitor $C_{int}$ 132 in a feedback loop of an amplifier 134. In addition to storing the charge value $Q_{in}$ 40 temporarily on a capacitor 136, the integrator 42 may serve to convert the charge value $Q_{in}$ 40 into a voltage equivalent. This voltage is fed into the low-pass-filter 44, which comprises a buffer 138, a tunable resistor R 140, and tunable capacitors $C_{lpf}$ 122 and $C_{bw}$ 142. Resistor R 140, and capacitors $C_{lpf}$ 122 and $C_{bw}$ 142 are tunable, thereby enabling the low-pass-filter 42 to be dynamically tuned to the low-pass-filter bandwidth of the channel 38 during A/D conversion to obtain faster settling times and lower noise effective bandwidth.

The double sampling amplifier 46, comprising integration capacitors $C_{dsa1}$ 144, $C_{dsa2}$ 146, and $C_{dsa3}$ 148 in feedback with an amplifier 150, amplifies the output of the low-pass-filter 44. The double sampling amplifier 46 may be a correlated double sampling amplifier, for removing any reset-offset pedestal, as well as any kTC and reset noise of the integrator 42. As described with reference to FIG. 12, $C_{dsa}$ 126 is the equivalent capacitance of capacitors $C_{dsa1}$ 144, $C_{dsa2}$ 146, and $C_{dsa3}$ 148. Each of the capacitors $C_{dsa1}$ 144, $C_{dsa2}$ 146, and $C_{dsa3}$ 148 are in series with clamping switches, which allow selection of a desirable equivalent capacitance of $C_{dsa}$ 126.

An offset generator 114 provides the offset value to the double sampling amplifier 46 at the input of amplifier 150. It may be noted that the offset generator 114 may be supplied with the linear ramp signal from DAC 32 for comparison at the comparator 116, as illustrated. As described previously with reference to FIG. 12, $C_{os}$ 124 is the equivalent offset capacitance.

The output of double sampling amplifier 46 is sampled and held within a comparator block 152. The comparator block 152 comprises capacitors $C_{s1}$ 154, $C_{s2}$ 156, and $C_{s2}$ 158, each being in series with clamping switches. The clamping switches allow selection of a desirable equivalent capacitance of $C_s$ 128. The sampled signal is compared with the linear ramp input from DAC 32. The linear ramp input from DAC 32 may be amplified by tuning capacitors $C_{dac1}$ 160 and $C_{dac2}$ 162, to provide an equivalent capacitance of $C_{dac}$ 130.

Digitization is achieved by disabling the parallel load of the counter value provided to the register 52 when the linear-polynomial ramp 64 exceeds the value held on the sample and hold capacitors $C_{s1}$ 154, $C_{s2}$ 156, and $C_{s2}$ 158. Pipelined conversion is facilitated by sampling and holding the charge value. Integration, conversion and transmission are pipelined in consecutive Sync cycles, which comprise the reading cycles.

Because $C_{lpf}$ 122, $C_{os}$ 124, $C_{dsa}$ 126, $C_s$ 128, and $C_{dac}$ 130 may be tuned by switching the clamping switches, the gain coefficient $$\alpha_{seg} = \left(\frac{C_{dac}}{C_{lpf}}\right) * \left(\frac{C_{dsa}}{C_s}\right),$$

and the offset coefficient $$\beta_{seg} = \frac{C_{os}}{C_{lpf}}$$

may be varied. This manipulation of coefficients may be performed on the fly or within the ARC 30 itself by providing a memory stack as a look-up table or a segment map.

Referring generally to FIG. 14, a diagrammatic view of an exemplary memory stack 164 utilized in the digital acquisition system is illustrated. The memory stack 164 comprises information stored in registers 166, each having bit allocations for the various segments. As illustrated, in each $i^{th}$ segment, for a range of input signals 40, an input signal resolution may be defined and a corresponding attenuation $$\frac{1}{Gain(i)}$$

and a $\beta_{seg}V_{offset}(i)$ value may be stored. Thus, memory stack 164 serves as a look-up-table that stores the different gain and offset combinations to be used in a given segment. It may be noted that in the memory stack 164, there may be as many registers as the number of segments. Such implementation may be used to determine the gain coefficient $\alpha_{seg}$ and offset coefficient $\beta_{seg}$.

The teachings of the present techniques may be implemented in systems where A/D conversion of a plurality of analog values is performed via a single DAC. Such systems may include digital X-ray systems, digital cameras, as well as other applications outside the imaging field. The teachings of the present techniques enable improved signal conversion, which minimizes the effects of dead zones and overlapped bands. Moreover, advantages of the techniques include increased dynamic range with faster rates of conversion at lower power consumption, appropriate signal conditioning prior to conversion, optimized noise performance, and self test capability without reliance on external stimulus for providing precise amounts of charge to validate the system. Dynamically changing the bandwidth during a scan may allow obtain faster settling times and lower noise effective bandwidth.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed as new and desired to be protected by Letters Patent of the United States is:

1. A method for calibrating a segmented analog to digital signal conversion system, comprising:
    segmenting a desired relationship between DAC output values and desired ADC input values into a plurality of segments, each of the plurality of segments comprising an offset value and a gain value;
    computing the offset value and an offset coefficient for each of the plurality of segments;
    computing the gain value and a gain coefficient for each of the plurality of segments; and
    storing the offset value and the gain value for each of the plurality of segments in a memory unit for reference in converting an analog signal to a digital signal based upon the gain value and offset value.

2. The method of claim 1, further comprising:
    receiving the analog signal; and
    sampling the analog signal for conversion to the digital signal in accordance with the stored offset and gain values.

3. The method of claim 2, wherein receiving the analog signal comprises receiving a plurality of analog signals.

4. The method of claim 1, wherein segmenting the desired relationship between DAC output values and desired ADC input values into the plurality of segments comprises segmenting the desired relationship between DAC output values and desired ADC input values into a plurality of linearized segments.

5. The method of claim 1, wherein computing the offset value and the offset coefficient comprises computing the offset value and the offset coefficient independently for each of a plurality of channels that share the DAC output values, based upon the analog signal received by each of the plurality of channels respectively.

6. The method of claim 5, wherein computing the gain value and the gain coefficient comprises computing the gain value and the gain coefficient via a shift operation independently for each of the plurality of channels.

7. The method of claim 1, wherein computing the offset value comprises computing a relation between offset values of contiguous segments for each of the plurality of segments.

8. The method of claim 1, wherein computing the gain value comprises computing a relation between gain values of contiguous segments for each of the plurality of segments.

9. The method of claim 1, wherein storing the offset value and the gain value comprises storing the offset coefficient and the gain coefficient for each of the plurality of segments in the memory unit.

10. A method for calibrating a segmented analog to digital signal conversion system, comprising:
    segmenting a desired relationship between DAC output values and desired ADC input values into a plurality of segments, each of the plurality of segments comprising an offset value and a gain value;
    computing the offset value and an offset coefficient for each of the plurality of segments; and
    storing the offset value and the offset coefficient for each of the plurality of segments in a memory unit for reference in converting an analog signal to a digital signal.

11. The method of claim 10, comprises:
    receiving a plurality of analog signals; and
    sampling each of the plurality of analog signals for conversion to respective digital signals in accordance with the stored offset values.

12. The method of claim 10, wherein computing the offset value and the offset coefficient comprises computing the offset value and the offset coefficient independently for each of a plurality of channels that share the DAC output values, based upon the analog signal received by each of the plurality of channels respectively.

13. The method of claim 10, wherein computing the offset value comprises computing a relation between offset values of contiguous segments for each of the plurality of segments.

14. The method of claim 10, wherein storing the offset value comprises converting the analog signal to the digital signal based on the offset value and the gain value.

15. A method for calibrating a segmented analog to digital signal conversion system, comprising:
    segmenting a desired relationship between DAC output values and desired ADC input values into a plurality of segments, each of the plurality of segments comprising an offset value and a gain value;
    computing the gain value and a gain coefficient for each of the plurality of segments; and
    storing the gain value and the gain coefficient for each of the plurality of segments in a memory unit for reference in converting an analog signal to a digital signal.

16. The method of claim 15, comprises:
receiving a plurality of analog signals; and
sampling each of the plurality of analog signals for conversion to respective digital signals in accordance with the stored gain values.

17. The method of claim 15, wherein computing the gain value and the gain coefficient comprises computing the gain value and the gain coefficient, via a shift operation, independently for each of a plurality of channels that share the DAC output values, based upon the analog signal received by each of the plurality of channels respectively.

18. The method of claim 15, wherein computing the gain value comprises computing a relation between gain values of contiguous segments for each of the plurality of segments.

19. The method of claim 15, wherein storing the gain value comprises converting the analog signal to the digital signal based on the offset value and the gain value.

20. A calibrated analog to digital converter configured to provide a digital output signal representative of an analog input signal, comprising:
a plurality of ADC channels, each of the plurality of ADC channels comprising:
an analog front-end operable to pre-condition the analog input signal;
a gain calculator operable to compute a gain value and a gain coefficient and operable to compute a relation between gain values of contiguous segments for each of a plurality of segments; and
an offset calculator operable to compute an offset value and an offset coefficient and operable to compute a relation between offset values of contiguous segments for each of the plurality of segments, wherein the gain calculator and the offset calculator are operable to provide a segment data and create each of the plurality of segments from a base ramp based on the segment data; and
a DAC coupled to each of the plurality of ADC channels and operable to provide a DAC output signal based on the base ramp and the segment data, wherein the analog input signal is compared with the DAC output signal in a selected segment of the DAC output signal for providing the digital output signal.

21. The calibrated analog to digital converter of claim 20, wherein each of the plurality of ADC channels comprises a memory unit configured to store the gain value, the offset value, the relation between offset values of contiguous segments, and the relation between gain values of contiguous segments.

22. The calibrated analog to digital converter of claim 20, wherein the plurality of segments comprises a plurality of linearized segments.

23. The calibrated analog to digital converter of claim 20, is configured to provide digital output signals for each of a plurality of analog input signals.

24. The calibrated analog to digital converter of claim 20, wherein the gain calculator is operable to compute the gain coefficient via a shift operation.

25. A data acquisition system for a digital X-ray panel, comprising:
a plurality of pixels, wherein each of the plurality of pixels is configured to store a charge; and
the calibrated analog to digital converter of claim 20, wherein each of the plurality of ADC channels is coupled to each of the plurality of pixels.

26. The data acquisition system of claim 25, wherein each of the plurality of ADC channels is operable to read the stored charge on each of the plurality of pixels respectively and wherein the stored charge is representative of an amount of X-ray signal each of the plurality of pixels is exposed to.

* * * * *